United States Patent
Iida et al.

(10) Patent No.: US 8,482,426 B2
(45) Date of Patent: Jul. 9, 2013

(54) SUBSTRATE PROCESSING APPARATUS

(75) Inventors: Tsukasa Iida, Tonamishi (JP); Akihiko Yoneda, Toyama (JP); Kaori Inoshima, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/805,889

(22) Filed: Aug. 23, 2010

(65) Prior Publication Data

US 2011/0012745 A1 Jan. 20, 2011

Related U.S. Application Data

(63) Continuation of application No. 11/991,093, filed as application No. PCT/JP2006/319014 on Sep. 26, 2006, now Pat. No. 7,808,396.

(30) Foreign Application Priority Data

Sep. 26, 2005 (JP) ................................ 2005-277618
Jun. 8, 2006 (JP) ................................ 2006-159513

(51) Int. Cl.
*G08B 3/00* (2006.01)

(52) U.S. Cl.
USPC ..................................... 340/691.1; 340/691.5

(58) Field of Classification Search
USPC .......... 340/691.1, 691.2, 691.4, 691.5, 691.8, 340/691.9, 591.9; 250/310; 436/1, 11, 164; 422/403, 404; 356/394, 237.1; 700/17, 49, 700/51, 52, 1, 121; 713/201; 118/715
See application file for complete search history.

(56) References Cited

U.S. PATENT DOCUMENTS

| | | | |
|---|---|---|---|
| 4,626,336 A | 12/1986 | Bloomquist et al. | |
| 4,790,921 A | 12/1988 | Bloomquist et al. | |
| 4,834,855 A | 5/1989 | Bloomquist et al. | |
| 6,476,913 B1 * | 11/2002 | Machida et al. | 356/394 |
| 6,485,979 B1 * | 11/2002 | Kippenhan et al. | 436/1 |
| 6,487,472 B1 * | 11/2002 | Song et al. | 700/121 |
| 6,567,168 B2 * | 5/2003 | Nara et al. | 356/394 |
| 6,849,151 B2 | 2/2005 | Barnes et al. | |
| 7,010,364 B1 * | 3/2006 | Singh et al. | 700/51 |
| 7,173,648 B1 | 2/2007 | Phan et al. | |
| 7,223,975 B2 * | 5/2007 | Nara et al. | 250/310 |
| 7,702,413 B2 | 4/2010 | Ushiku et al. | |
| 2002/0013908 A1 * | 1/2002 | Nishihata et al. | 713/201 |
| 2002/0138814 A1 | 9/2002 | Katayama | |
| 2008/0210162 A1 * | 9/2008 | Yonebayashi | 118/715 |

FOREIGN PATENT DOCUMENTS

| | | |
|---|---|---|
| JP | A-09-251938 | 9/1997 |
| JP | A-2000-30999 | 1/2000 |
| JP | A-2001-257140 | 9/2001 |
| JP | A-2002-268720 | 9/2002 |
| JP | A-2004-128203 | 4/2004 |
| JP | A-2005-93922 | 4/2005 |

* cited by examiner

*Primary Examiner* — Van T. Trieu
(74) *Attorney, Agent, or Firm* — Oliff & Berridge, PLC

(57) ABSTRACT

It is intended to provide a substrate processing apparatus capable of reliably informing a running state of the apparatus. The substrate processing apparatus having a signal indicator for indicating the running state, including a signal indicator capable of setting at least one operation condition under which the signal indicator operates as well as of operating under anyone of a plurality of operation conditions and a display unit capable of displaying that a cause of the operation is anyone of the operation conditions during the operation of the signal indicator.

18 Claims, 14 Drawing Sheets

FIG.7

| RUNNING STATE OF SUBSTRATE PROCESSING APPARATUS 100 |
|---|
| ... |
| ... |
| APPARATUS "RESET" |
| APPARATUS "WAITING FOR START" |
| APPARATUS "RUN" |
| APPARATUS "END" |
| APPARATUS "IDLE" |
| ... |
| ... |

SOUND CONTROL
PROGRAM 40

FIG.13

| CODE | APPARATUS STATE | BUZZER TYPE | SOUND TIME (SECOND) |
|---|---|---|---|
| 1 | RESET | CONTINUOUS SOUND 2 | 01:00 |
| 2 | WAITING FOR START | CONTINUOUS SOUND 1 | NOT STOPPING AUTOMATICALLY |
| 3 | RUN | INTERMITTENT SOUND 4 | 00:30 |
| 4 | END | NO SOUND | NO SETTING |
| 5 | IDLE | NO SOUND | NO SETTING |
| 6 | HOLD | INTERMITTENT SOUND 3 | NOT STOPPING AUTOMATICALLY |
| 7 | READY | CONTINUOUS SOUND 3 | 00:30 |
| . | . | . | . |
| . | . | . | . |

OVERALL
OPERATION
S10

SUBSTRATE PROCESSING APPARATUS

This is a Continuation of application Ser. No. 11/991,093 (now U.S. Pat. No. 7,808,396), filed Apr. 23, 2008, which in turn is a National Stage of PCT/JP2006/319014, filed Sep. 26, 2006, which claims priority of Japanese Patent Application Nos. 2005-277618, filed Sep. 26, 2005 and 2006-159513, filed Jun. 8, 2006. The disclosures of the prior applications are hereby incorporated by reference herein in their entirety.

BACKGROUND

1. Technical Field

This invention relates to a substrate processing apparatus for processing substrates of semiconductor devices and the like.

2. Related Art

In the substrate processing apparatuses of this type, a signal indicator has widely been used as a means for displaying (informing) a running state to the outside of the apparatus. For example, as the signal indicator, a buzzer (device for making continuous sound, intermittent sound, or voice), a signal tower (device for lighting or blinking lamps of plural colors aligned by color), and the like are generally used. Such signal indicator operates (makes sound, turns light on, blinks, or turns light off) by predetermined operation conditions set by a user (operator) to inform the running state of the substrate processing apparatus to the outside. Though the function of recognizing normal/abnormal has been sufficient in conventional buzzers, there is a demand for enhancement of buzzer function since the operation conditions of the signal indicator have become complicated.

Particularly, in a large-scale factory or the like where plural substrate processing apparatuses are installed, there is a demand for a signal indicator capable of recognizing each of running states of the substrate processing apparatuses on real-time basis.

In the operation conditions for operating the signal indicator, it is possible to set not only one operation condition (for example, turn light on (make sound) when the substrate processing apparatus is in A-state) but also plural operation conditions (for example, turn light on when the substrate apparatus is in A-state or B-state).

DISCLOSURE OF THE INVENTION

Problem to be Solved by the Invention

However, there has been a problem that it is difficult to recognize under which one of the operation conditions the current signal (operation state of the signal indicator) is being displayed on the signal indicator in the case of controlling the signal indicator under the plural operation conditions.

An object of this invention is to provide a substrate processing apparatus that solves the above-described problem and is capable of displaying under which one/ones of a plurality of operation conditions a signal indicator operates.

Means for Solving the Problem

This invention is characterized by a substrate processing apparatus comprising a signal indicator for indicating a running state, comprising a signal indicator operating under any one of a plurality of operation conditions and a display unit for displaying that a cause of the operation is anyone of the plural operation conditions during the operation of the signal indicator.

Preferably, a signal tower is provided as the signal indicator, and the display unit displays an operation state of the signal tower.

Preferably, a buzzer is provided as the signal indicator, and the display unit displays an operation state of the buzzer.

Preferably, a logical formula and brackets are set independently in a frame as each of the operation conditions.

Preferably, the display unit displays under which one of the operation conditions the signal indicator operates.

Preferably, the display unit displays presence/absence of instruction from a host computer in addition to the operation condition. In the case where maintenance is required, a remote instruction is given to a predetermined substrate processing apparatus for calling a worker. By controlling the operations of the signal tower and the buzzer, it is possible to easily grasp the predetermined substrate processing apparatus even when a plurality of substrate processing apparatuses are aligned in a factory.

Preferably, the display unit displays the operation state by selecting a priority order.

Preferably, it is possible to select either one of the operation condition or the instruction from the host computer to be prioritized.

Effect of the Invention

According to this invention, even in the case where the signal indicator operates under the plural conditions, it is possible to display under which one/ones of the operation conditions the signal indicator operates, thereby informing a running state of the substrate processing apparatus without fail.

BRIEF DESCRIPTION OF THE DRAWINGS

[FIG. 7] A diagram showing a table indicating one example of running state of the substrate processing apparatus which is an operation condition of the signal indicator of the substrate processing apparatus according to the embodiment of this invention.

[FIG. 13] A diagram showing one example of relationship stored in a memory relating unit of the sound control program.

DESCRIPTION OF REFERENCE NUMERALS AND SIGNS

Figure 1:
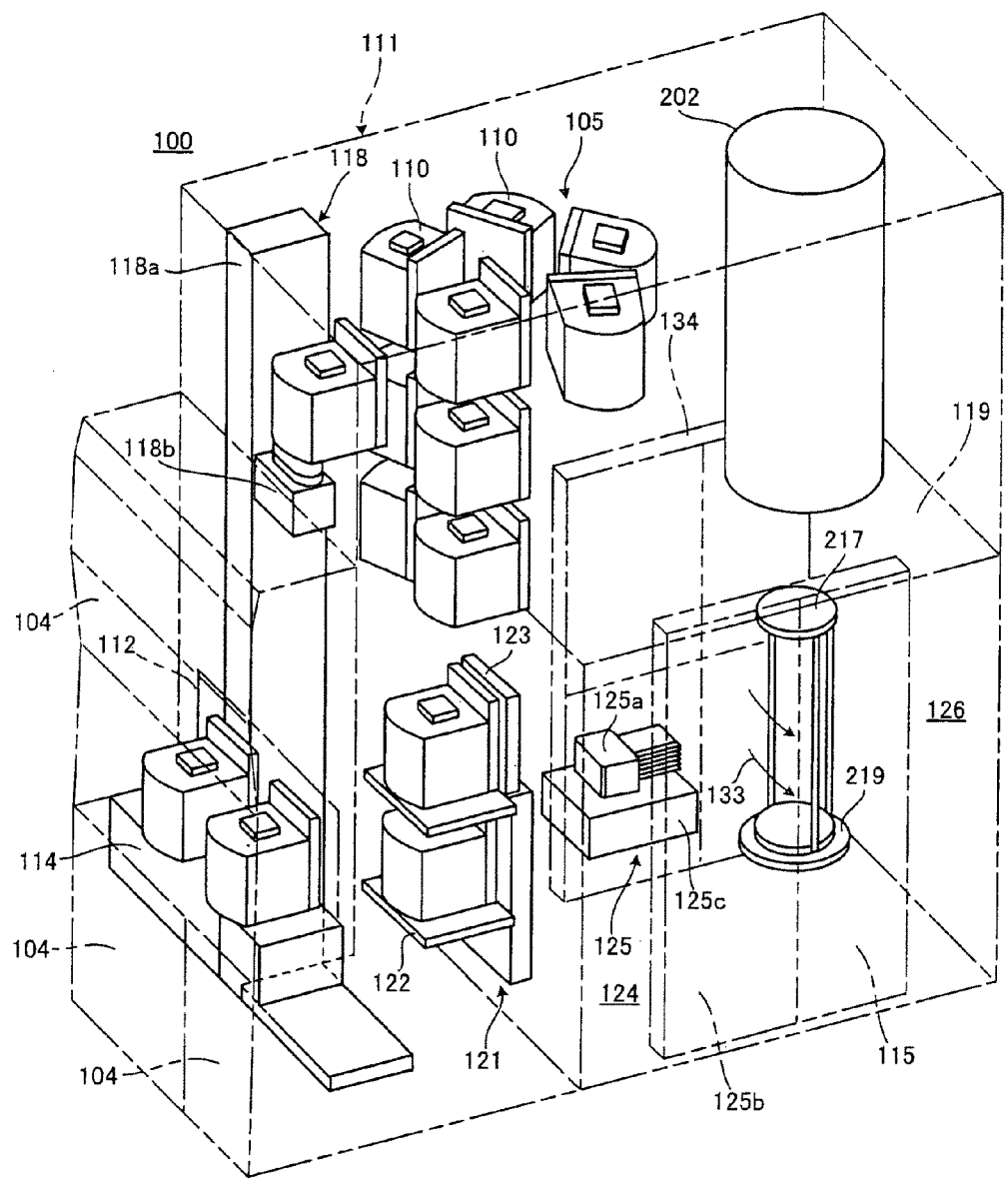
[FIG. 1] A perspective view showing a substrate processing apparatus according to one embodiment of this invention.

5: signal control program
40: sound control program
100: substrate processing apparatus
103: front maintenance opening
104: front maintenance door
105: rotational pod shelf
110: pod
111: housing
111a: front wall
112: pod carrying in/out opening
113: front shutter
114: load port
115: boat elevator
116: columnar support
117: rack
118: pod conveying device
118a: pod elevator
118b: pod conveying mechanism
119: sub-housing
119a: sub-housing front wall
120: wafer carrying in/out opening
121: pod opener
122: placing table
123: cap attaching/detaching mechanism
124: transfer chamber
125: wafer transfer mechanism
125a: wafer transfer device
125b: wafer transfer device
125c: tweezers
126: stand-by unit
128: arm
133: clean air
134: clean unit
135: notch matching device
147: furnace shutter
200: wafer
202: processing furnace
217: boat
219: sealing cap
300: substrate processing system
302: host computer
304: communication line
306: signal indicator
308: signal tower
310: buzzer
312: UI device
314: display unit
316: first monitor screen
318: first input screen
320: signal control device
322: CPU
324: memory
326: operation condition
330: access management unit
332: control unit
334: signal I/0 unit
340: color distinction input section
342: priority setting input section
344: lighting condition input section
346: first device state input section
348: first approval condition input section
350: blinking condition input section
352: second device state input section
354: second approval condition input section
358: lighting state display section
360: blinking state display section
362: host icon
364: second input screen
366: tone distinction input section
368: sound condition input section
370: third device state input section
372: third approval condition input section
374: second monitor screen
376: sound state display section
378: sound absence/presence display unit
380: second host icon
400: substrate processing control unit
402: state receiving unit
404: sound control unit
406: setting unit
408: relationship storage unit
S10: overall operation

BEST MODE FOR CARRYING OUT THE INVENTION

Figure 2:
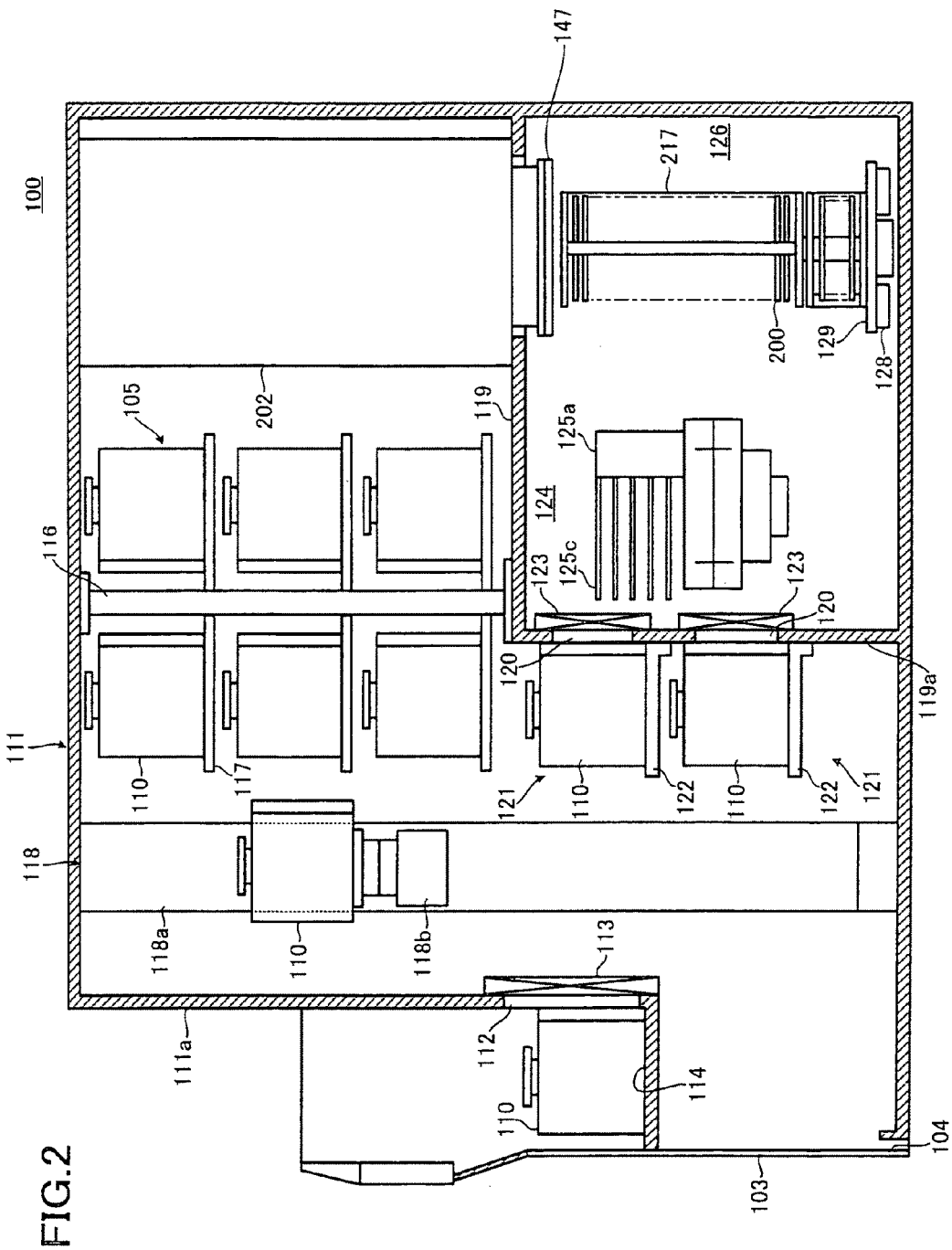
[FIG. 2] A sectional side view showing the substrate processing apparatus according to the embodiment of this invention.

In the best mode for carrying out this invention, a substrate processing apparatus is structured as a semiconductor production apparatus performing a processing device in a production method of semiconductor devices (IC) by way of example. In the following description, a case of using a vertical apparatus (hereinafter simply referred to as processing apparatus) performing oxidization, diffusion processing, CVD processing, and the like on substrates as the substrate processing apparatus will be described. FIG. 1 is a perspective view showing the substrate processing apparatus applied to this invention. FIG. 2 is a sectional side view of the substrate processing apparatus of FIG. 1.

As shown in FIGS. 1 and 2, the substrate processing apparatus 100 of this invention using a hoop (substrate container; hereinafter referred to as pod) 110 as a wafer carrier housing a wafer 200 made from silicon and the like is provided with a housing 111. A front maintenance opening 103 is formed as an aperture on a front part of a front wall 111a of the housing 111 for enabling maintenance, and front maintenance doors 104, 104 are attached for open/close the front maintenance opening 103.

A pod carrying in/out opening (substrate container carrying in/out opening) 112 is formed on the front wall 111a of the housing 111 in such a fashion as to provide communication between inside and outside of the housing 111, and the pod carrying in/out opening 112 is opened/closed by a front shutter (substrate container carrying in/out opening open/close mechanism) 113.

A load port (substrate container delivery table) 114 is formed on a front side of the pod carrying in/out opening 112, and the load port 114 has such a structure that the pod 110 is placed thereon for positioning. The pod 110 is carried in on the load port 114 and carried out from the load port 114 by an in-process conveyer (not shown).

In an upper part at a central part in a cross direction of the housing 111, a rotational pod shelf (substrate container placing shelf) 105 is disposed, and the rotational pod shelf 105 has a structure for storing a plurality of pods 110. That is, the rotational pod shelf 105 is disposed upright and provided with a columnar support 116 intermittently rotated in a horizontal plane and a plurality of racks (substrate container placing table) 117 supported radially to the columnar support 116 at respective positions of upper, middle and lower stage, and the plurality of racks 117 have a structure of retaining the pods 110 in a state where the pods 110 are respectively placed on the racks 117.

A pod conveying device (substrate container conveying device) 118 is disposed between the load port 114 and the rotational pod shelf 105 in the housing 111 and formed of a pod elevator (substrate container elevating mechanism) 118a capable of elevation while retaining the pod 110 and a pod conveying mechanism (substrate container conveying mechanism) 118b as a conveying mechanism for conveying the pod 110 among the load port 114, the rotational pod shelf 105, a pod opener (substrate container cover open/close mechanism) 121 by a continuous operation of the pod elevator 118a and the conveying mechanism 118b.

A sub-housing 119 extends to a rear end in the housing 111 in a lower part at a substantially central part in the cross direction of the housing 111. A pair of wafer carrying in/out openings (substrate carrying in/out openings) 120 for carrying in/out a wafer 200 to/from the sub-housing 119 is formed on a front wall 119a of the sub-housing 119, the wafer carrying in/out openings 120 being aligned along a vertical direction as two stages, and each of the upper and lower wafer carrying in/out openings 120 being provided with the pod opener 121. Each of the pair of pod openers 121, 121 is provided with placing tables 122, 122 and cap attaching/detaching mechanisms (cover attaching/detaching mechanisms) 123, 123 for attaching and detaching a cap (cover) of the pod 110. The pod opener attaches and detaches the cap of the pod 110 placed on the placing table 122 by the cap detaching/attaching mechanism 123 to open and close a wafer taking in/out opening of the pod 110.

The sub-housing 119 forms a transfer chamber 124 which is fluidically isolated from a space in which the pod conveying device 118 and the rotational pod shelf 105 are installed. A wafer transfer mechanism (substrate transfer mechanism) 125 is disposed at a front region of the transfer chamber 124 and is formed of a wafer transfer device (substrate transfer device) 125a capable of rotating and directly operating the wafer 200 in a horizontal direction and a wafer transfer device elevator (substrate transfer device elevation mechanism) 125b for elevating the wafer transfer device 125a. As schematically shown in FIG. 1, the wafer transfer device elevator 125b is disposed between a right end of the pressure-resistant housing 111 and a right end of the front region of the transfer chamber 124 of the sub-housing 119. By a continuous operation of the wafer transfer device elevator 125b and the wafer transfer device 125a, the wafer 200 is loaded (charging) and unloaded (discharging) on and from a boat (substrate holder) 217 by using tweezers (substrate holding member) 125c of the wafer transfer device 125a as a placing unit of the wafer 200.

A stand-by unit 126 for housing the boat 217 for stand-by is formed in a rear region of the transfer chamber 124. A processing furnace 202 is provided above the stand-by unit 126. A lower end of the processing furnace 202 is opened and closed by a furnace shutter (furnace open/close mechanism) 147.

As schematically shown in FIG. 1, a boat elevator (substrate retaining elevation mechanism) 115 for elevating the boat 217 is disposed between a right end part of the pressure resistant housing 111 and a right end part of the stand-by unit 126 of the sub-housing 119. A sealing cap 219 serving as a cover is horizontally fixed to an arm 128 serving as a connection member connected to a platform of the boat elevator 115 and has a structure of vertically supporting the boat 217 and capable of closing the lower end of the processing furnace 202.

The boat 217 is provided with a plurality of holding members and has a structure of horizontally retaining a plurality of (for example, about 50 to 125) wafers 200 in a state where the wafers 200 are aligned vertically with centers thereof being kept in line with one another.

As schematically shown in FIG. 1, a clean unit 134 formed of a supply fan for supplying a clean air 133 which is a cleaned atmosphere or an inert gas and a dust-proof filter is provided at a left end of the transfer chamber 124, which is opposite to the side at which the wafer transfer device elevator 125b and the boat elevator 115 are provided, and a notch matching device 135 serving as a substrate alignment device for aligning positions of the wafers in a circumferential direction is disposed, though not shown, between the wafer transfer device 125a and the clean unit 134.

The clean air 133 blown out from the clean unit 134 is flown to the notch matching device 135, the wafer transfer device 125a, and the boat 217 in the stand-by unit 126 and then drawn by a duct not shown to be discharged outside the housing 111 or circulated to a first side (supply side) which is an drawing side of the clean unit 134 so as to be blown out into the transfer chamber 124 again by the clean unit 134.

Hereinafter, an operation of the substrate processing apparatus 100 of this invention will be described.

As shown in FIGS. 1 and 2, when the pod 110 is supplied to the load pot 114, the pod carrying in/out opening 112 is opened by the front shutter 113, and the pod 110 on the load port 114 is carried to the inside of the housing 111 though the pod carrying in/out opening 112 by the pod conveying device 118.

The pod 110 thus carried in is automatically conveyed and delivered to the designated rack 117 of the rotational pod shelf 105 by the pod conveying device 118 to be temporarily stored and then conveyed and delivered to one of the pod openers 121 from the rack 117 to be temporarily stored, followed by being conveyed from the rack 117 to the pod opener 121 to be transferred to the placing table 122 or being conveyed directly to the pod opener 121 to be transferred to the placing table 122. In this case, the wafer carrying in/out opening 120 of the pod opener 121 is closed by the cap attaching/detaching mechanism 123, so that the clean air 133 is flown to the transfer chamber 124 to fill up the transfer chamber 124. For example, by filling the transfer chamber 124 with a nitrogen gas as the clean air 133, an oxygen concentration is set to 20 ppm or less which is very much lower than that inside (under the atmosphere of) the housing 111.

When an opening side end face of the pod 110 placed on the placing table 122 is pressed against an aperture rim of the wafer carrying in/out opening 120 at the front wall 119a of the sub-housing 119, the cap is detached by the cap attaching/detaching mechanism 123 to open the wafer taking in/out opening.

When the pod 110 is opened by the pod opener 121, the wafers 200 are picked up from the pod 110 by the tweezers 125c of the wafer transfer device 125a through the wafer taking in/out opening and aligned by the notch matching device 135 not shown and then carried to the stand-by unit 126 at the rear part of the transfer chamber 124 to be loaded (charging) on the boat 217. The wafer transfer device 125a that has delivered the wafers 200 to the boat 217 returns to the pod 110 to load next wafers 110 to the boat 217.

During the loading work in one of the pod openers 121 (upper or lower pod opener) of the wafers to the boat 217 by the wafer transfer mechanism 125, another pod 110 is conveyed and transferred from the rotational pod shelf 105 to the other pod opener 121 (upper or lower pod opener) by the pod conveying device 118, so that an opening work of the pod 110 by the pod opener 121 is performed simultaneously with the loading work.

When a predetermined number of wafers 200 is loaded on the boat 217, the lower end of the processing furnace 202 that has been closed by the furnace shutter 147 is opened by the furnace shutter 147. Subsequently, the boat 217 retaining the wafers 200 is carried (loaded) into the processing furnace 202 as a sealing cap 219 being elevated by the boat elevator 115.

After the loading, an arbitrary processing is performed on the wafers 200 in the processing furnace 202.

After the processing, the wafers 200 and the pod 110 are withdrawn outside the housing by a procedure reverse to the above-described procedure except for the wafer alignment step by the notch matching device 135 not shown.

Hereinafter, one example of substrate processing system 300 using the above-described substrate processing apparatus 100 will be described based on FIG. 3.

Figure 3:
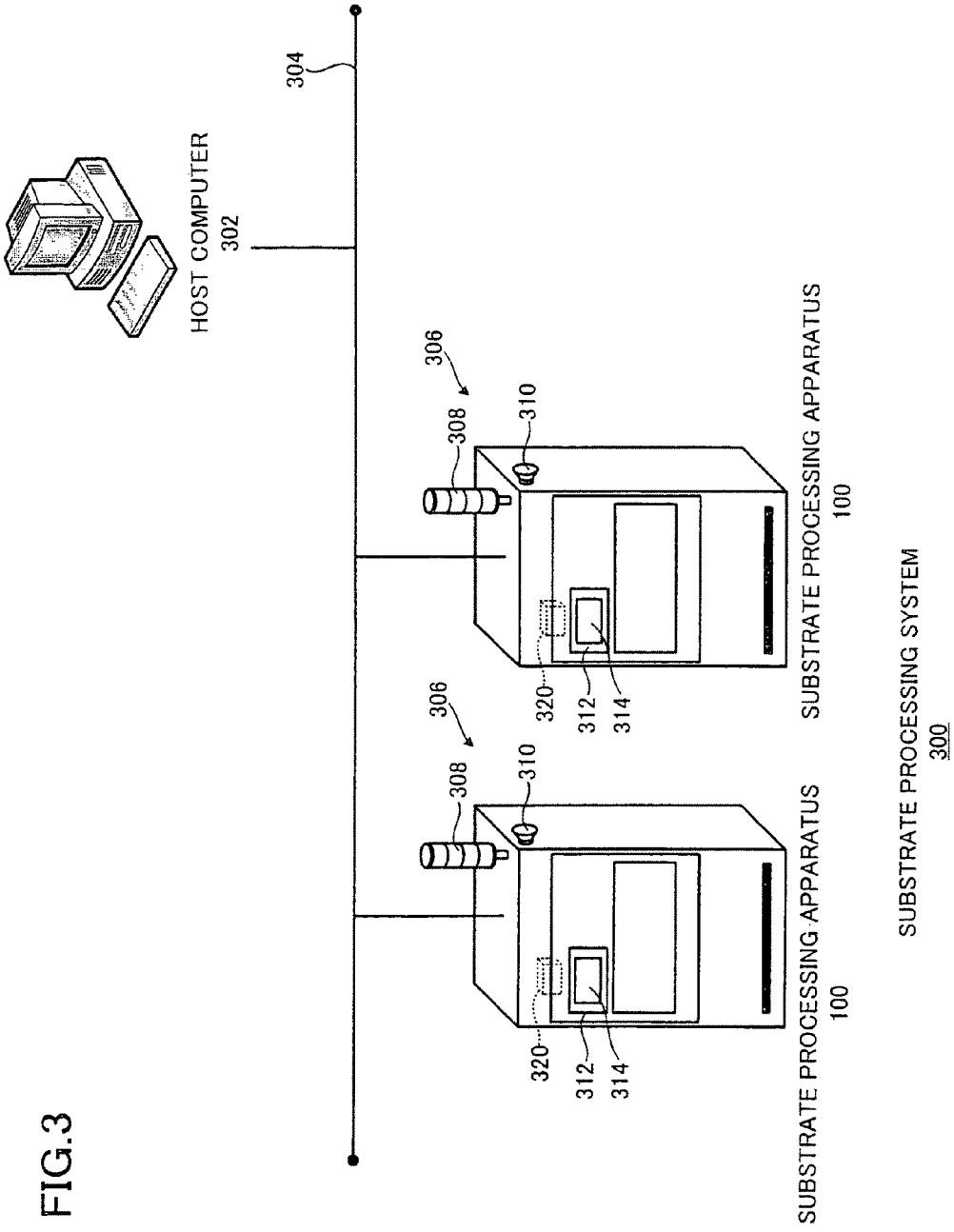
[FIG. 3] A diagram showing one example of a structure of a substrate processing system using the substrate processing apparatus according to the embodiment of this invention.

As shown in FIG. 3, the substrate processing system 300 has a host computer 302 and a plurality of the above-described substrate processing apparatuses 100. The substrate processing apparatuses 100 and the host computer 302 are connected to each other via a communication line 304 such as LAN, so that instructions (output signal) from the host computer 302 are sent (outputted) to the substrate processing apparatuses.

Each of the substrate processing apparatuses 100 has a signal indicator 306. More specifically, as the signal indicator 306, a signal light (signal tower 308) and a sound outputting device (buzzer 310) are provided, and the signal tower 308 and the buzzer 310 operate to indicate an operation state of the substrate processing apparatus 100 to the outside.

The signal tower 308 has light sources that are LEDs or bulbs are layered as a plurality of stages (for example, four stages), and the light sources emit lights different in color from one another (for example, red, green, yellow, and blue). The light sources (colors) are operated independently (light-on, blinking, or light-off) or operated as the light sources (colors) being combined (merged) (for example, all colors are blinking).

The buzzer 310 is capable of making (operating) sounds such as a continuous sound, an intermittent sound, voice, and a melody at a predetermined sound pressure level.

The signal tower 308 and the buzzer 310 are capable of outputting the operation state (for example, light-on, blinking, making sound, and the like) to a predetermined device that is connected thereto as an output value.

A user interface device (UI device) 312 is provided integrally with the substrate processing apparatus 100 or via a network. The UI device 312 has a panel (display unit 314) of liquid crystal display, for example, and a display screen (for example, a first monitor screen 316 and a second monitor screen 374 described later in this specification) and an operation screen (for example, a first input screen 318 and a second input screen 364 described later in this specification) are displayed on the display unit 314. The display screen displays an operation state (light-on, blinking, making sound, etc.) that indicates an operation condition under which the signal indicator 306 operates and that the signal indicator 306 satisfies the operation condition, and it is possible to input (set) in the operation screen at least one operation condition under which the signal indicator 306 operates.

A signal control device 320 is provided in the substrate processing apparatus 100, and the above-described host computer 302, the signal indicator 306, and the UI device 312 are connected to the signal control device 320 via an electric line or a communication line, so that the signal control device 320 controls the signal indicator 306, the UI device 312, and the like.

Figure 4:
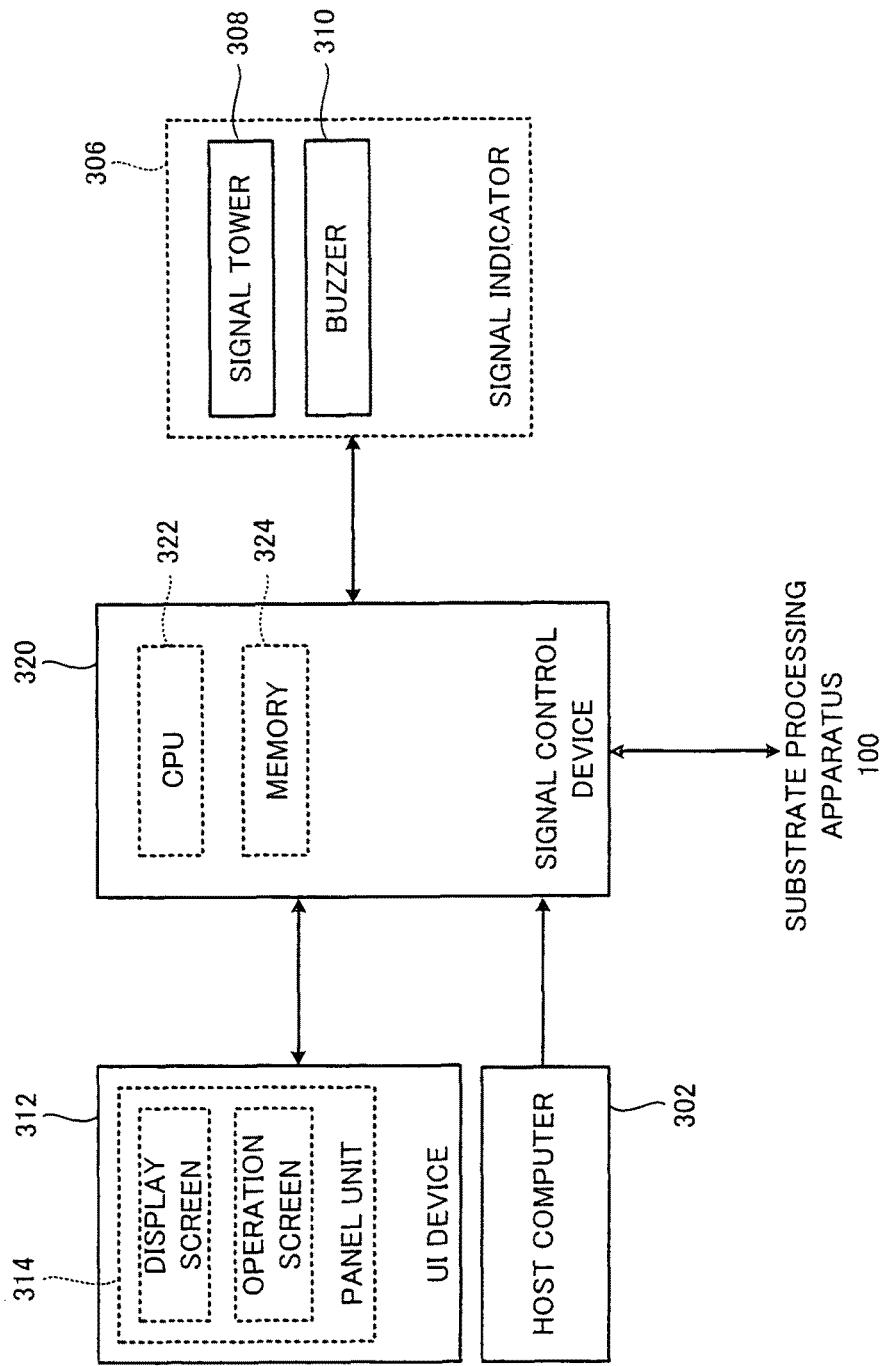
[FIG. 4] A diagram showing one example of a hardware structure centered on a control device of the substrate processing apparatus according to the embodiment of this invention.

Shown in FIG. 4 is a hardware structure centered on the signal control device 320.

As shown in FIG. 4, the signal control device 320 includes a CPU 322, a memory 324, and the like, and a signal control program 5 that will be described later in this specification is memorized (stored) in the signal control device 320. The signal control device 320 controls the operation of the signal indicator 306 via the host computer 302 and the UT device 312 and displays the operation state and the like of the signal indicator 306 on the UI device and the like in response to a request from a user (operator). Also, the signal control device 320 acquires information relating to the running state of the substrate processing apparatus 100 from the apparatus. The running state and the operation of the signal indicator 306 will be described later in this specification. Though the display screen and the operation screen are displayed on one screen in FIG. 4, it is needless to mention that a mode of switching between the screens to be displayed is encompassed by the scope of this invention.

Figure 5:
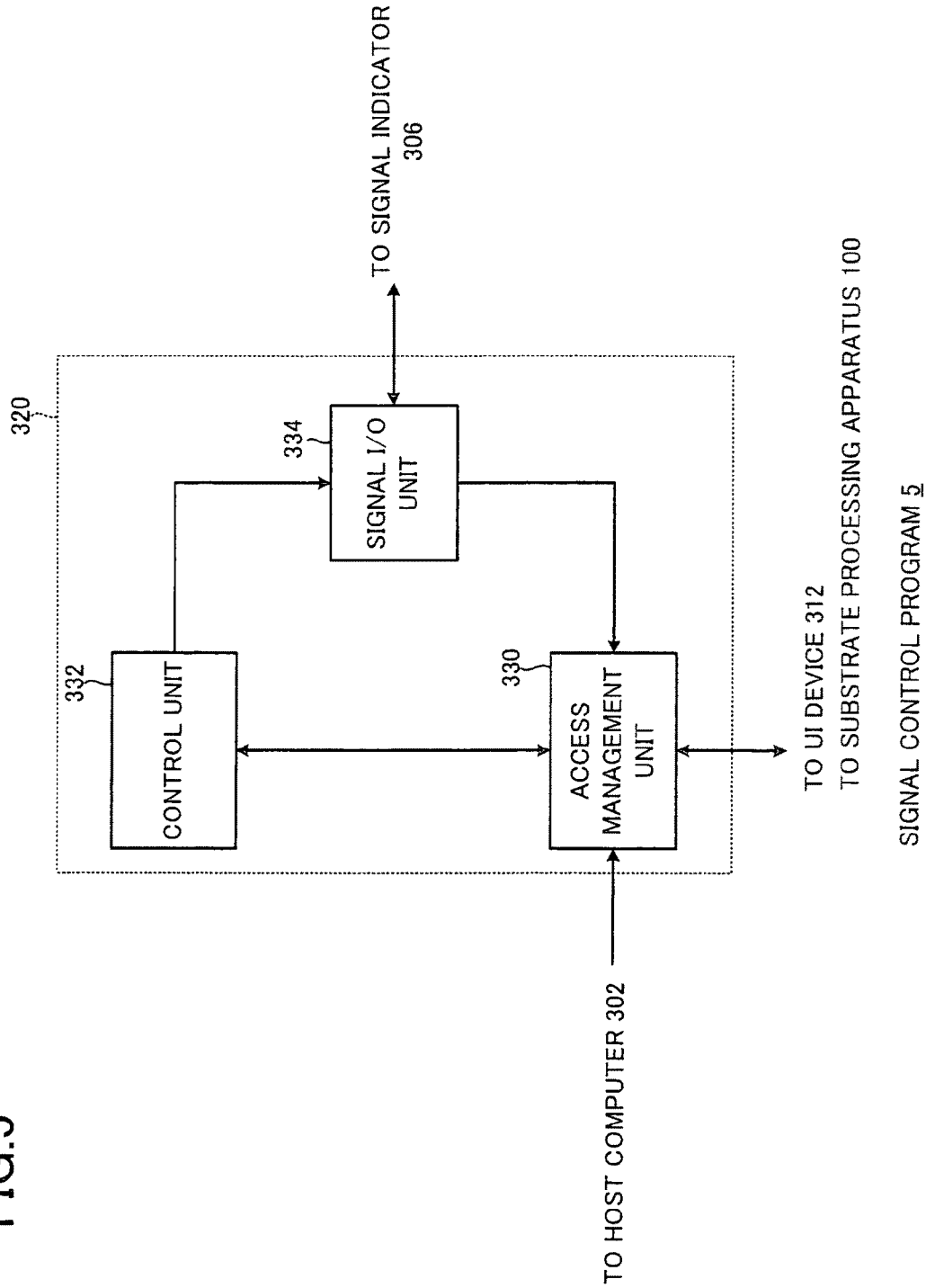
[FIG. 5] A diagram showing one example of a function structure of a signal control program that is executed by a signal control device of the substrate processing apparatus according to the embodiment of this invention.

Shown in FIG. 5 is a function structure of the signal control program 5 executed by the signal control device 320. As shown in FIG. 5, the signal control program 5 has an access management unit 330, a control unit 332, and a signal I/O unit 334.

The access management unit 330 receives instructions of the operation condition of the signal indicator 306 from the user (operator) via the host computer 302 and the UI device 312. The access management unit 330 decodes the operation condition of the signal indicator 306 given from the user (operator) to check whether or not there is an error in the given operation condition and, in the case where a result of the checking is NG, displays the check result on the display unit 314 of the UI device 312. In the case where the check result is OK, the access management unit 330 sends the operation condition to the control unit 332.

The access management unit 330 manages user authentication (access control), data coding, and connection conditions (continuous connection/irregular connection) and has a function of translation by performing a predetermined processing for executing a word (text or source code) that is inputted as a command from an external devices (host computer 302, UI device 312, etc.).

The access management unit 330 receives a translation result (in a state where the condition is approved) of the operation condition of the signal indicator 306 from the control unit 332 as described later in this specification and also receives a monitoring result (operation state) of the signal indicator 306 by the signal I/O unit 334. Further, the access management unit 330 displays the operation condition of the signal indicator 306 and the operation state of the signal indicator 306 on the display screen of the UI device 312 and updates the display screen at a predetermined interval.

The control unit 332 receives the operation condition of the signal indicator 306 sent from the access management unit 330 and translates the operation condition by performing a predetermined processing condition to decide an output value to the signal indicator 306. The control unit 332 sends the decided output value to the signal I/O unit 334 simultaneously sends (informs) the translation result of the operation condition (in the state where the condition is approved) to the access management unit 330.

The signal I/O unit 334 outputs the output value sent from the control unit 332 to the signal indicator 306. The signal I/O unit 334 receives an output value of the operation state (state of lighting, blinking, making sound, or the like) sent from the signal indicator 306 and continuously monitors the output value to send a result of the monitoring (operation state of signal indicator 306) to the access management unit 330.

Hereinafter, a series of processings for displaying an operation condition and an operation state of the signal indicator 306 will be described based on FIG. 6. Shown in FIG. 6 is a flowchart in the series of processings for displaying an operation condition and an operation state of the signal indicator 306.

Figure 6:
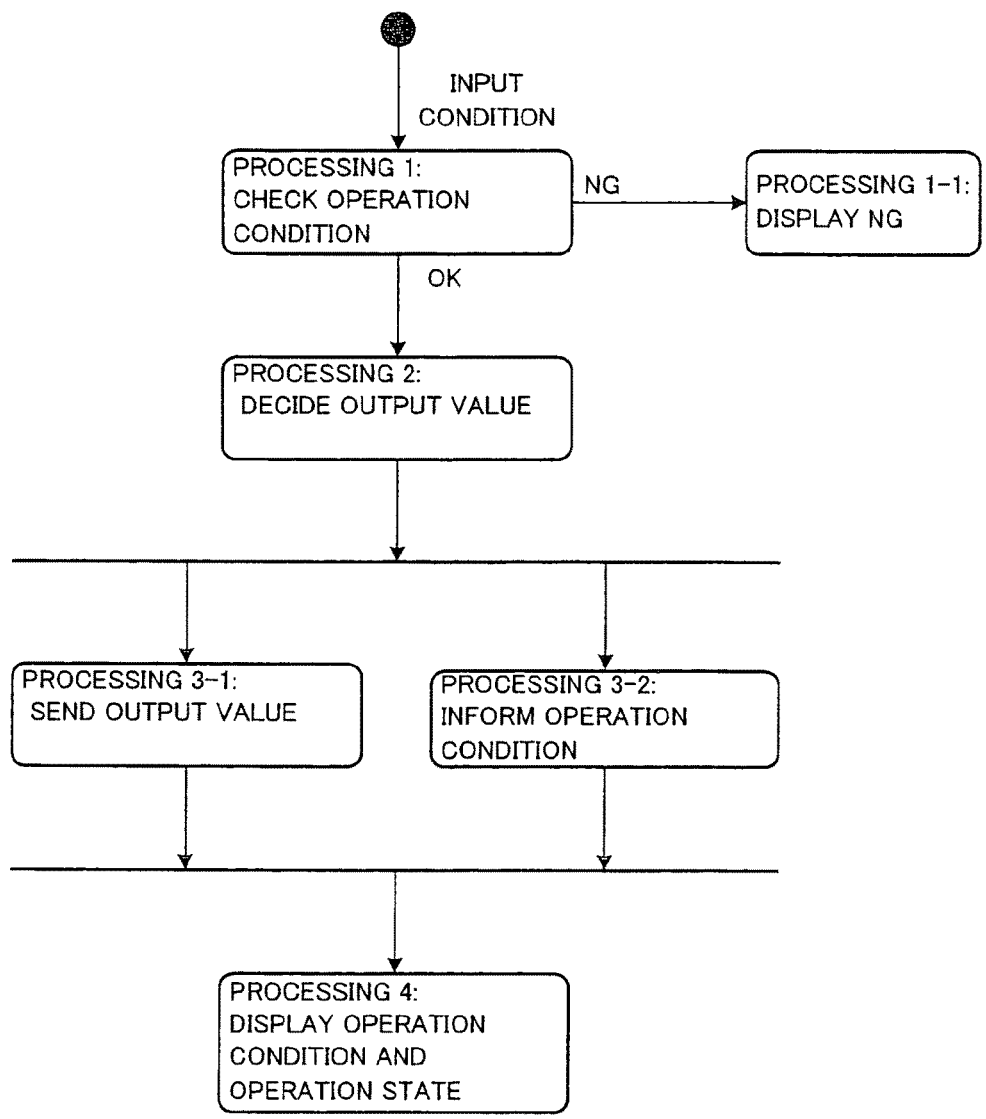
[FIG. 6] A flowchart showing a series of processings for displaying an operation condition and an operation state in the signal indicator of the substrate processing apparatus according to the embodiment of this invention.

As shown in FIG. 6, in Processing 1, the access management unit 330 receives an operation condition of the signal indicator 306 inputted by a user (operator) to the input screen of the UI device 312 and check (judges) whether or not there is an error in the given operation condition (whether or not there is a lack of bracket, or whether or not there is input omission as described later in this specification). In the case where a result of the checking is OK (no error), the operation condition is sent to the control unit 332 to proceed to Processing 2. In the case where the checking result is NG (there is an error), the process proceeds to Processing 1-1 to display a factor for the NG checking result (cause) and the checking result on the display screen of the UI device 312.

In Processing 2, the control unit 332 receives the operation condition of the signal indicator 306 sent from the access management unit 330 and translates the operation condition by performing a predetermined processing on the operation condition to decide an output value to the signal indicator 306.

In Processing 3-1, the control unit 332 sends the decided output value to the signal I/O unit 334. The signal I/O unit 334 outputs the output value sent from the control unit 332 to the signal indicator 306. Further, since the signal I/O unit 334 receives an operation state (state of lighting, blinking, making sound, or the like) sent from the signal indicator 306 and continuously monitors the output value to send the monitoring result (operation state of signal indicator 306) to the access management unit 330.

In Processing 3-2, the control unit 332 sends (informs) the operation condition of the signal indicator 306 to the access management unit 330 simultaneously with Processing 3-1.

In Processing 4, the access management unit 330 receives the operation condition of the signal indicator 306 from the control unit 332 and the operation state of the signal indicator 306 from the signal I/O unit 334. The access management unit 330 displays the operation condition and the operation state of the signal indicator 306 on the display screen of the UI device 312 and updates the display screen at a predetermined interval.

Hereinafter, a method for displaying the operation condition and the operation state of the signal indicator 306 will be described based on FIGS. 7 to 11.

Shown in FIG. 7 is one example (part) of running state of the substrate processing apparatus 100, which is the operation condition of the signal indicator 306 (signal tower 308 and buzzer 310). As shown in FIG. 7, it is possible to set a plurality of factors (requirements) as the conditions for operating the signal indicator 306. That is, the user (operator) may set one factor (requirement) (such as "apparatus: waiting for start" shown in FIG. 7) as the operation condition of the signal indicator 306 or may set (for example "apparatus: RESET" or apparatus: "waiting for start") by using a logical formula (or logical theoretical formula such as AND and OR).

[Signal Tower]
[Input Screen]

Figure 8:
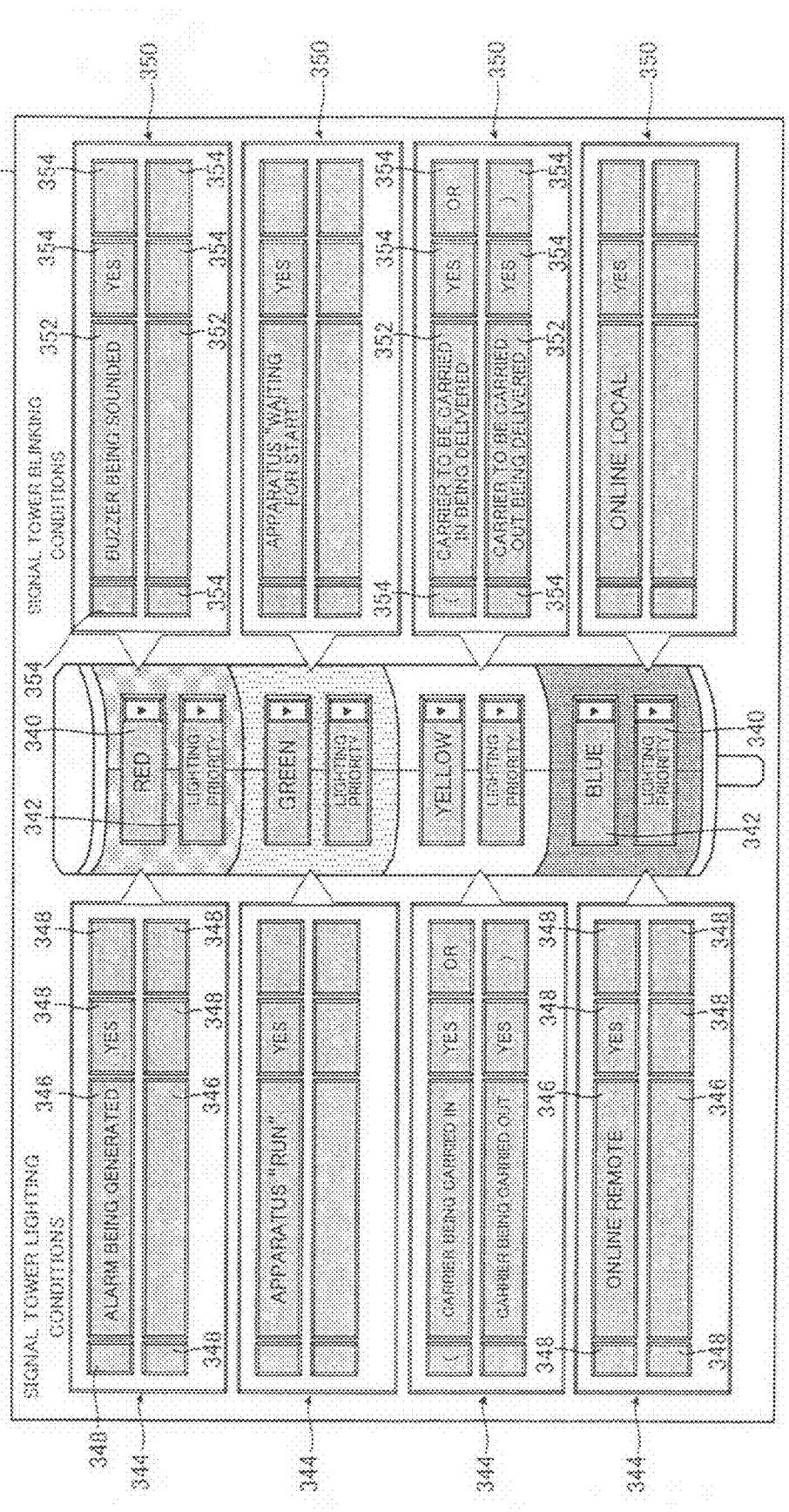
[FIG. 8] A diagram showing one example of a first input screen displayed on a display unit of the substrate processing apparatus according to the embodiment of this invention.

Shown in FIG. 8 is a first input screen 318 which is an operation screen displayed on the display unit 314 of the UI device 312. The user operates on the first input screen 318 to set an operation condition of the signal tower 308.

As shown in FIG. 8, it is possible to set a lighting condition of the signal tower 308 and a blinking condition of the signal tower 308 in the first input screen.

At a central part of the first input screen 318, a plurality of (for example, four) color distinction input sections 340 are displayed. The color distinction input sections 340 are used for setting light emission colors of the signal towers 308 by selection among four colors, for example (e.g. red, green, yellow, and blue, etc.). Also, priority set ting input sections 342 (for example, four priority setting input sections 342) respectively corresponding to the color distinction input sections 340 are displayed below the color distinction input sections 340. A priority operation (lighting operation and blinking operation) of the light emission color set by each of the color distinction input sections 340 is set by each of the priority setting input sections 342. That is, it is possible to select and display the priority order of the operation conditions (lighting operation, blinking operation, etc.) of the signal towers 308.

Also, lighting condition input sections 344 (for example, four lighting condition input sections) corresponding to the color distinction sections 340 are displayed on the first input screen 318. Each of the lighting condition input sections 344 has a plurality of first device state input sections 346 and a plurality of first approval condition input sections 348.

To each of the plurality of (for example, two) first device state input sections 346, an running state (for example, "carrier being carried in", "carrier being carried out", and the like) of the substrate processing apparatus 100 when lighting the light emission color (color selected in the color distinction input section 340) of the signal tower 308 is inputted. The device state inputted to the first device state input section 346 is used as a component in a logical formula described later in this specification).

In each of the plurality of (for example, six) first approval condition input sections 348, a conjunction (for example, or, and, yes, no, and the like) in the logical formula and brackets is inputted.

That is, in the lighting condition input section 344, it is possible to set the logical formula (component and conjunction) and brackets in each of frames (e.g. first device state input section 340, first approval condition input section 348, and the like) as a lighting condition (operation condition) of the signal tower 304. Therefore, the lighting condition is easy to view, thereby preventing a setting error even when there is a lighting condition having two or more sets of brackets.

Also, it is possible to set a plurality of conditions (requirements) as a logical formula satisfying the lighting condition (operation condition) of the signal tower 308. For example, as shown in FIG. 8, it is possible to set the condition of lighting the yellow of the signal tower 308 as a logical formula of "carrier being carried in, or carrier being carried out", for example.

Also, blinking condition input sections 350 (for example, four blinking condition input sections 350) corresponding to the color distinction sections 340 are displayed on the input screen 318. Each of the blinking condition input sections 350 has a plurality of second device state input sections 352 having a function same as that of the lighting condition input sections 344 and a plurality of second approval condition input sections 354. Though only two operation conditions are inputted to the lighting condition input section 344 and the blinking condition input section 350 in FIG. 8, the number of operation states is not limited thereto, and it is possible to input more operation states.

Also, a priority instruction setting input section not shown is displayed on the first input screen 318. By setting the priority instruction setting input section, it is possible to select which one of the operation condition set by the lighting condition input section 344 and the like and the instruction from the host computer 302 is to be prioritized.

The logical formula is not limited to those described above, and it is possible to set a more complicated logical formula. For example, in the case where: the first component is A; the second component is B; and the third component is C, it is possible to set a complicated logical formula such as (A) or ((B and C)). Also, since it is possible to set the logical formula and the brackets in one frame even when the condition satisfied by the logical formula is complicated, it is possible not only to prevent setting error but also to offer a display that is easy for users to understand.

The settings of the operation conditions of the signal tower 308 are not limited to those described above, and it is possible to input settings for repeating the lighting operation and the blinking operation of one color at a constant interval.

[Monitor Screen]

Figure 9:
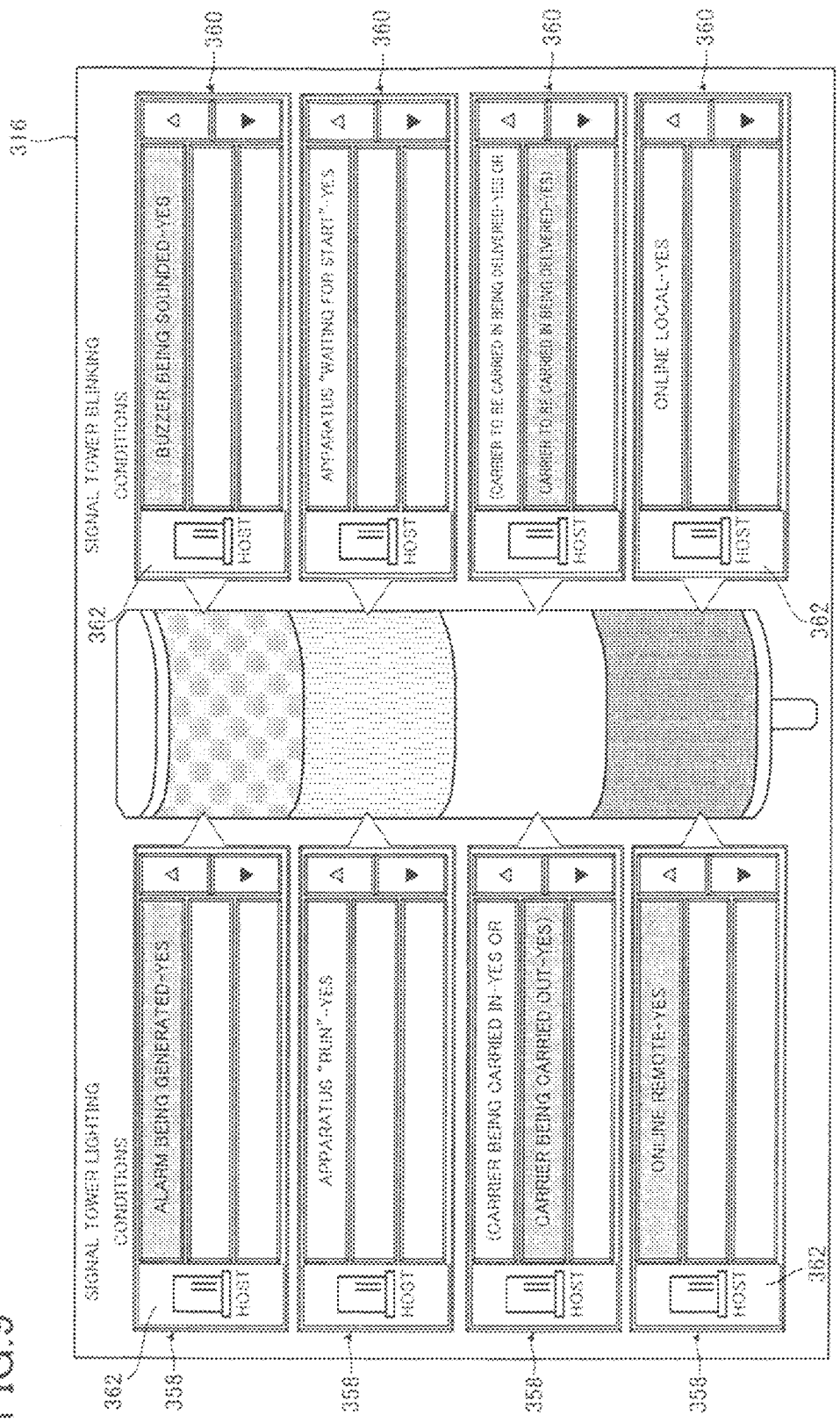
[FIG. 9] A diagram showing one example of a first monitor screen displayed on the display unit of the substrate processing apparatus according to the embodiment of this invention.

Shown in FIG. 9 is the first monitor screen 316 as a display screen displayed on the display unit 314 of the UI device 312. The user watches (confirms) the first monitor screen 316 to understand the operation conditions and the operation states of the signal towers 308.

As shown in FIG. 9, the first monitor screen displays the operation conditions (lighting conditions and blinking conditions) of the signal towers 308 set on the first input screen 318 and current operation states of the signal towers 308.

At a central part of the first monitor screen 316, the colors (for example, four colors of red, green, yellow, and blue, etc.) set by the color distinction sections 340 of the above-described first input screen 318 are displayed.

Also, lighting state display sections 358 corresponding to the colors set by the color distinction input sections 340 are displayed on the first monitor screen 316. In the lighting state display sections 358, the lighting conditions set by the lighting condition input sections 344 are respectively displayed, and, in the case where the lighting condition is satisfied, the satisfaction of the lighting condition is indicated. More specifically, a background color of a part of the lighting condition display section 358 is displayed with a color different from that of the rest of the background part. Therefore, in the case where the signal tower 308 satisfies plural lighting conditions (in the case where plural lighting conditions are set), it is displayed which ones of the lighting conditions are satisfied for the lighting.

Also, blinking states display sections 360 corresponding to the colors set by the color distinction input sections 340 are respectively displayed on the first monitor screen 316. In the blinking state display sections 360, the blinking conditions set by the blinking condition input sections 350 are displayed, and, in the case where the blinking condition is satisfied, the satisfaction of the blinking condition is indicated. More specifically, a background color of a part of the blinking condition display section 360 is displayed with a color different from that of the rest of the background part. Therefore, in the case where the signal tower 308 satisfies plural blinking conditions (in the case where plural blinking conditions are set), it is displayed which ones of the blinking conditions are satisfied for the blinking.

Also, each of the lighting condition display sections 358 and the blinking state display sections 360 has a host computer instruction display section (first host icon 362). The first host icon 362 is displayed when there is an instruction (settings for lighting condition and blinking condition of signal tower 308, etc.) from the host computer 302.

For example, as shown in FIG. 9, in the case where the yellow lighting condition of the signal tower 308, i.e. a lighting condition of "carrier being carried in or carrier being carried out", for example, is displayed and that a background color of the display section of the lighting condition of the "carrier being carried out" is different from that of the rest of background part, the user (operator) understands that yellow of the signal tower 308 is lit due to the condition (factor) of "carrier being carried out".

Also, the user (operator) confirms whether or not there is an instruction from the host computer 302 by the presence/absence of the display of the host icon 362.

In the case where a light source (color) is added to the signal tower 308 and there is an instruction from the host computer 302, the added light source (color) may be operated (lit, blinked, etc.). With such configuration, it is possible to clearly separate the lighting condition (factor) inputted by the user (operator) and the operation (lighting, blinking) under the instruction from the host computer 302. Therefore, only by watching the lighting state of the signal tower 308, the user (operator) understands that the lighting state is the instruction from the host computer 302 and is not relevant to the running state of the substrate processing apparatus 100. Also, in the case where there is an instruction from the host computer 302, plural light sources (colors) may be operated (lit, blinked, etc.) at once without limitation to the operation of one light source.

[Buzzer]

Hereinafter, a method for displaying an operation condition and an operation state of the buzzer 310 will be described based on FIGS. 10 and 11. Description that overlaps with the above-described signal tower operation condition and the operation state display method will be omitted.

[Input Screen]

Figure 10:
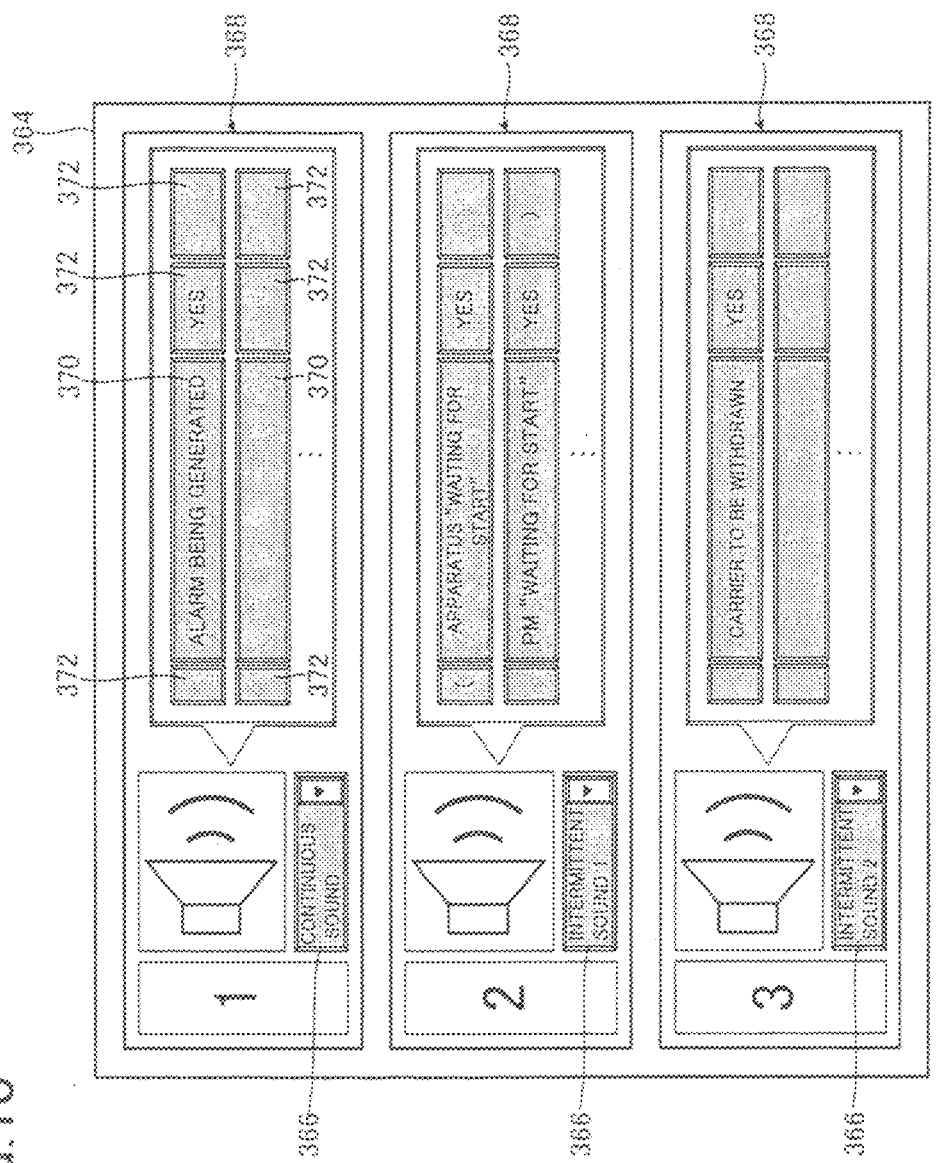
[FIG. 10] A diagram showing one example of a second input screen displayed on the display unit of the substrate processing apparatus according to the embodiment of this invention.

Shown in FIG. 10 is a second input screen 364 as an operation screen displayed on the display unit 314 of the DI device 312. The user operates the second input screen 364 to set the operation conditions of the buzzers 310.

A plurality of (for example, three) tone distinction input sections 366 are displayed on the second input screen 364. In each of the tone distinction input sections 366, a selection is made from three types of tones (continuous sound, intermittent sound 1, and intermittent sound 2, etc.), for example, to set the tone of the buzzer 310. Also, in the vicinity of the tone distinction input sections 366, sound condition input sections (for example, three sound condition input sections) 368 corresponding to the tone distinction input sections 366 are displayed. Each of the sound condition input sections 368 has a plurality of third device state input sections 370 and a plurality of third approval condition input sections 372.

[Monitor Screen]

Figure 11:
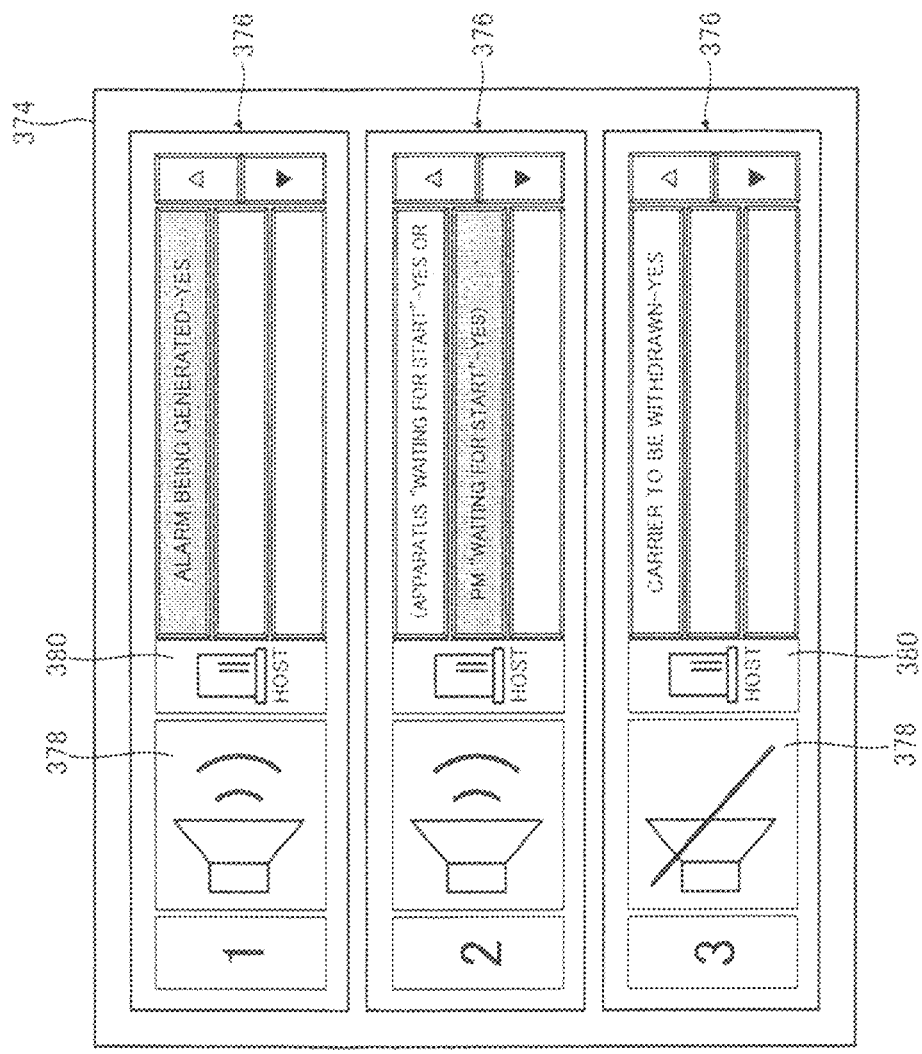
[FIG. 11] A diagram showing one example of a second monitor screen displayed on the display unit of the substrate processing apparatus according to the embodiment of this invention.

Shown in FIG. 11 is the second monitor screen 374 as a display screen displayed on the display unit 314 of the UI device 312. The user watches (confirms) the second monitor screen 374 to understand the sound conditions (operation conditions) and the sound states (operation state) of the buzzers 310.

As shown in FIG. 11, sound state display sections 346 indicating the operation condition (sound condition) of the buzzers 310 set in the second input screen 364 and current operation states of the buzzers 310 are displayed on the second monitor screens 374.

The sound (operation) conditions set by the sound condition input sections 368 are respectively displayed in the sound state display sections 376, and, in the case where the sound condition is satisfied, the satisfaction of the sound condition is indicated. More specifically, a background color of a part of the sound condition display section 376 is displayed with a color different from that of the rest of the background part. Therefore, in the case where the buzzer 310 satisfies plural sound conditions (in the case where plural sound conditions are set), it is displayed which one/ones of the sound conditions is/are satisfied for the sound (operation) Further, in each of the sound condition display sections 376, a sound presence/absence display section 378 indicating a current sound state (presence/absence of sound) of the buzzer 310 is displayed. Though the sound conditions of "1" and "2" are satisfied in FIG. 11, either one of the tones may be prioritized. For example, only the tone corresponding to "alarm being generated" which is the sound condition of "1" may be sounded.

Also, each of the sound state display sections 360 has a host computer instruction display section (second host icon 380). The second host icon 380 is displayed when there is an instruction (setting for sound condition of buzzer 310, etc.) from the host computer 302.

As described in the foregoing, by displaying the operation conditions of the signal indicator 306 and the operation states of the signal indicator 306 on the display screen of the UI device 312, it is possible to display under which one/ones of the operation conditions the operation is executed even when plural operation conditions are set in the signal indicator 306, thereby making it possible for the user (operator) to correctly understand the current state of the substrate processing apparatus 100. Also, in the case where the operation condition of the signal indicator 306 is different from that expected by the user, it is possible to judge whether the control abnormality is due to software (operation condition is incorrect) or hardware (malfunction of the equipment, erroneous wiring) by confirming (watching) the monitor screen (first monitor screen 316 and second monitor screen 374) (by confirming the current operation condition of the signal indicator 306 and the operation state of the signal indicator 306).

Hereinafter, an operation validation of the signal indicator 306 will be described.

As one example of the operation validation in the signal indicator 306, an operation validation is performed on the signal tower 308. More specifically, signal lighting (blinking) conditions are set by the first input screen 318 displayed on the display unit 314, and the operation conditions (lighting or blinking) of the signal tower 308 displayed on the first monitor screen 316 of the display unit 314 and the operation conditions (lighting or blinking) of the signal tower actually provided in the upper part of the substrate processing apparatus 100 are compared to each other for confirmation.

In this case, when a desired operation is not performed actually in the signal tower 308 though the signal tower 308 displayed on the first monitor screen 316 of the display unit 314 performs the desired operation, there may be a malfunction in the hardware such as erroneous wiring and disconnection.

In turn, when the desired operation is not performed in either one of the signal towers 308 (response is not received from the actually provided signal tower 308 and the first monitor screen 316), there may be not only malfunction in the hardware such as erroneous wiring and disconnection but also setting condition input error and software malfunction.

When results of checking all of the lighting (blinking) conditions relating to the signal tower 308 are OK, the operation validation of the signal tower 308 is terminated.

As described above, by performing the operation validation on both of the signal tower 308 displayed on the operation screen and the signal tower 308 actually provided in the substrate processing apparatus, it is possible to judge whether the control abnormality is due to the software or due to the hardware, thereby making it easy to perform the operation validation when an error occurs.

Also, in the case where the condition is satisfied that the plural buzzers 310 in the plural substrate processing apparatuses 100 are simultaneously sounded, since the operation conditions of the buzzers 310 and the operation states of the buzzers 310 are displayed on the second monitor screen 374, it is possible for the user (operator) to make judgment not only auditory (by the ears) but also visually, thereby making it possible to prevent erroneous judgment.

Further, by providing a plurality of buzzers different in tone in addition to the error reporting buzzer (alarm buzzer) as in the setting screen of FIG. 10 of this invention, it is possible to more effectively inform the people around the apparatus about the apparatus state. For example, when developing and studying the film formation technology or performing maintenance work, the workers around the apparatus is informed of the apparatus running state only by hearing the tone.

Figure 12:
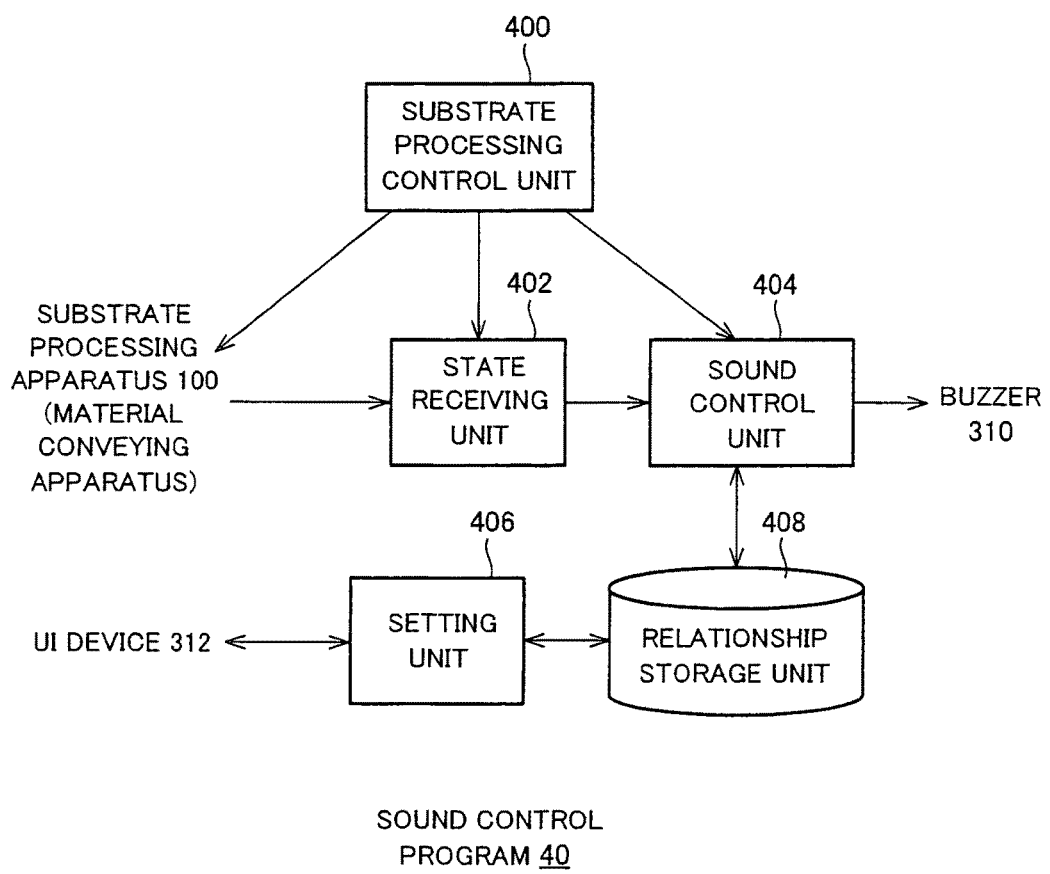
[FIG. 12] A diagram showing a structure of a sound control program operating on the signal control device.

FIG. 12 is a diagram showing a structure of the sound control program 40 operating on the signal control device 320.

As shown in FIG. 12, the sound control program 40 has a substrate processing control unit 400, a state receiving unit 402, a sound control unit 404, a setting unit 406, and a relationship storage unit 408. The sound control program 40 is stored in the signal control device 320 and loaded on the memory 324 to be executed by the CPU 332 on an OS not shown.

In the sound control program 40, the substrate processing control unit 400 controls the program and other components to issue processing instructions relating to the substrate processing to the substrate processing apparatus 100 and a material conveying apparatus. For example, the substrate processing control unit 400 issues a wafer transfer instruction and a wafer collection instruction after film formation processing to the material conveying apparatus. Also, the substrate processing control unit 400 issues a wafer processing instruction to the substrate processing apparatus 100. Further, the substrate processing control unit 400 performs data transmission and reception with the host computer 302 relating to the state of the substrate processing apparatus 100.

The relationship storage unit 408 stores a relationship of a state of at least one of the substrate processing apparatus 100 and the material conveying apparatus and the mode of sound made by the buzzer 310. More specifically, the relationship storage unit 408 stores a relationship of a state of the substrate processing apparatus 100 and a buzzer type and a sound time of the buzzer 310 that sounds when the state occurs. One embodiment of the relationship will be described later in this specification. The relationship storage unit 408 is realized by at least one of the memory 324 or a storage device not shown.

The state receiving unit 402 receives reports of states of the substrate processing apparatus 100, the material conveying apparatus, and the host computer 302 outputted from the apparatuses to output the reports to the sound control unit 404.

The sound control unit 404 controls the sound of the buzzer 310 based on the states received by the state receiving unit 402 and the relationship stored in the relationship storage unit 402. More specifically, upon reception of the apparatus states from the state receiving unit 402, the sound control unit 404 refers to the relationship storage unit 408 to confirm the mode of sound of the buzzer 310 in the states. The relationship storage unit 408 controls the buzzer type and the sound time of the buzzer 310 based on the mode to cause the buzzer 310 to sound.

The setting unit 406 sets the relationship stored in the relationship storage unit 408. More specifically, the setting unit 406 registers, updates, and deletes data of the relationship stored in the relationship storage unit 408 based on contents sent via the UI device 312 from the workers.

FIG. 13 is a diagram showing one example of relationship stored in the relationship storage unit 408 of the sound control program 40.

A shown in FIG. 13, each of the relationship data includes an apparatus state, a buzzer type, and a sound time (seconds). The apparatus state indicates a state of the substrate processing apparatus 100 and the like and includes reset, waiting for start, run, end, idle, hold, ready, and the like. The buzzer type is the type of the buzzer sounded by the buzzer 310 when the corresponding apparatus state occurs, which is anyone of continuous sounds 1 to 4, intermittent sounds 1 to 4, and no sound. The sound time indicates a length of time during which the buzzer 310 sounds.

For example, in the case where the signal control device 320 receives a report informing that the apparatus state is "not ready", the signal control device 320 does not cause the buzzer 310 to sound since the state is not included in the relationship indicated on FIG. 13. For example, in the case where the signal control device 320 receives a report informing that the apparatus state is "reset", the signal control device 320 controls the buzzer 310 to sound a buzzer of the continuous sound 2 for one minute.

Also, when the signal control device 320 receives a report informing that the apparatus state is "waiting for start", for example, the signal control device 320 causes the buzzer of the continuous sound 1 to be sounded continuously, and the buzzer is manually stopped by the worker. For example, in the case where the signal control device 320 receives a report informing that the apparatus state is "end", though the state is included in the relationship indicated in FIG. 13, the signal control device 320 does not cause the buzzer 10 to sound since the buzzer type is "no sound".

In the case where the sound time is set to "not stopping automatically", the sound may be stopped when the apparatus state is changed to another state by the worker. The relationships stored in the relationship storage device 408 are not limited to the present examples and may contain other data. For example, the operation states of the signal towers may be added.

Hereinafter, the states of the apparatus received by the state receiving unit 402 of the sound control program 40 will be described in detail.

The apparatus states include an apparatus mode indicating a mode of state under which the substrate processing apparatus 100 and the like operate, a carrier conveyance indicating a mode of conveyance of the carrier in the substrate processing steps, and host communication indicating a state of data transmission and reception with the host computer 302. Hereinafter, each of states of the apparatus mode, the carrier conveyance, and the host communication will be described.

The apparatus mode state include reset, waiting for start, run, end, idle, hold, ready, PM waiting for start, step buzzer and alarm being generated.

"Reset" means that the apparatus has stopped in a safe state. In the case where apparatus maintenance is performed by human intervention, it is necessary that the apparatus is stopped in the safe state. "Waiting for start" means that in a case of ultimately confirming setting contents or the like before executing a job, or in a case of requiring human intervention when deciding an execution timing, preparation for job execution has been made and start instruction is awaited.

"Run" means that the job has been executed. "End" means that a recipe in a processing apparatus has been terminated. Furnace maintenance is performed after executing the recipe in the processing apparatus in some cases. "Idle" means that the processing furnace is in the stand-by state. When the processing furnace is in the stand-by state, it is possible to perform processing that is to be performed by the furnace alone. "Hold" means a temporary halt state. Job execution or recipe execution is temporarily stopped, and the factor for the temporary stop should be eliminated by human intervention. "Ready" means that the apparatus is in the stand-by state. Since it is possible to execute a next job when the substrate processing apparatus 100 and the material conveying apparatus are at the stand-by state, human intervention is required for job generation, carrier preparation, and the like.

"PM waiting for start" means a state of waiting for a start of a recipe the substrate processing apparatus 100 alone. In the case where the recipe is executed by the substrate processing apparatus 100 alone, human intervention is required for considering an apparatus state and an execution timing before execution. "step buzzer" means that the processing designated by the recipe has been executed. It is necessary to confirm a progress of the recipe or human intervention is required in a main part of the recipe in some cases. "Alarm being generated" means that abnormality has occurred in the apparatus. In the case where abnormality occurs in the apparatus, human intervention is required.

The state of the carrier conveyance include carrier 45 being conveyed, carrier being carried out, carrier to be carried in being delivered, carrier to be carried out being delivered, carrier to be withdrawn, finished carrier, carrier for processing, free space in buffer [production], free space in buffer [monitor], free space in buffer [monitor-2], free space in buffer [return monitor], free space in buffer [return monitor-2], load port [automatic], and load port [manual].

"Carrier being carried in" means a period until termination of conveyance of all the designated carriers. When the plural carriers are carried into an internal buffer, the carriers are set one by one by on the load port by human intervention. "Carrier being carried out" means a period until all the supported carriers are carried out. When plural carriers are carried out from an internal buffer, the carriers are taken out one by one from a load port by human intervention.

"Carrier to be carried in being delivered" means that the load port is being opened/closed. In the case where a carrier is carried into an internal buffer, the load port open/close operation is performed by human intervention. "Carrier to be carried out being delivered" means that the load port open/close operation is being performed. When a carrier is carried out from an internal buffer, the load port open/close operation is performed by human intervention. "Carrier to be withdrawn"

means that a carrier is in a state of being in the load port after being carried out. It is necessary that the carrier is carried out from the apparatus and taken out from the load port by human intervention.

"Finished carrier" means that there is a processed carrier staying in an internal buffer. When the carrier from which the processed wafers are collected stays in the internal buffer, it is necessary to carry out the carrier by human intervention. "Carrier waiting for processing" means that an unprocessed carrier stays in an internal buffer. In the case where the unprocessed carrier stays in the apparatus, it is necessary to perform processing on wafers inside the carrier by human intervention.

"Free space in buffer [production]" means that there is a free space in an internal buffer of a carrier for production. In the case where there is a free space in the internal buffer of the carrier for production in the apparatus, preparation for the next processing is made by carrying in a carrier for production. "Free space in buffer [monitor]" means that there is a free space in an internal buffer of a carrier for monitor. In the case where there is a free space in the internal buffer of the carrier for monitor in the apparatus, preparation for the next processing is made by carrying in a carrier for monitor. "Free space in buffer [monitor-2]" means that there is a free space in an internal buffer of a carrier for monitor-2. In the case where there is a free space in the internal buffer of the carrier for monitor-2 in the apparatus, preparation for the next processing is made by carrying in a carrier for monitor-2.

Free space in buffer [return monitor]" means that there is a free space in an internal buffer of a carrier for return monitor. In the case where there is a free space in the internal buffer of the carrier for return monitor in the apparatus, preparation for the next processing is made by carrying in a carrier for return monitor. "Free space in buffer [return monitor-2]" means that there is a free space in an internal buffer of a carrier for return monitor-2. In the case where there is a free space in the internal buffer of the carrier for return monitor-2 in the apparatus, preparation for the next processing is made by carrying in a carrier for return monitor-2.

Load port [automatic]" means that the load port is under automatic control. In the case where the load port is set to an automatic control mode, it is informed that human intervention is unnecessary. "Load port [manual]" means that the load port is under manual control. In the case where the load port is set to a manual control mode, it is informed that human intervention is required in the following carrier carrying in/out.

The host communication states include online [remote], online [local], and offline.

"Online [remote]" means that [remote mode] is designated at the host, and the apparatus state is being reported. Communication with the host computer 302 is performed, and it is informed that the report to the host computer 302 has been done. "Online [local]" means that [local mode] is designated at the host, and the apparatus state is being reported. Communication with the host computer 302 is performed, and it is informed that the report to the host computer 302 has been done. "Offline" means that no communication is made with the host computer 302. It is informed that communication with the host computer 302 is not performed.

Figure 14:
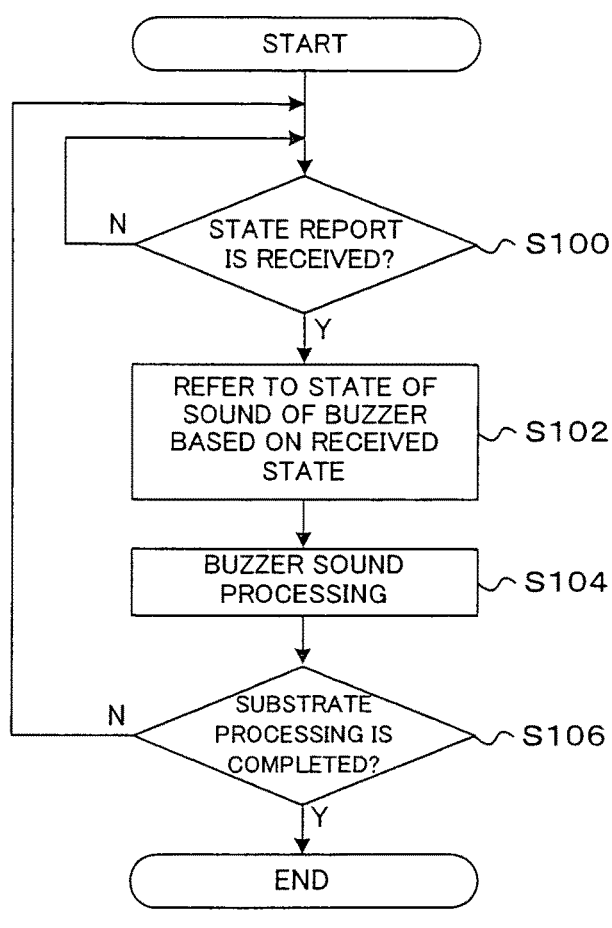
[FIG. 14] A flowchart showing an overall operation (S10) of the substrate processing apparatus according to the embodiment of this invention.

FIG. 14 is a flowchart showing an overall operation (S10) of the substrate processing apparatus 100 according to the embodiment of this invention.

In the substrate processing apparatus 100, the substrate processing control unit 400 of the sound control program 40 operating on the signal control device 320 performs the control. As shown in FIG. 14, in step 100 (S100), the state receiving unit 402 judges whether or not reports of states of the apparatuses such as the substrate processing apparatus 100 and the material conveying apparatus have been received from the apparatuses. The sound control program 40 proceeds to the processing of S102 when the apparatus state reports have been received. If not, the process returns to the processing of S100. For example, the state receiving unit 402 receives a report informing that a state of the apparatus is "ready" in the case where the substrate processing apparatus 100 is in a ready state, a report informing that a state of the apparatus is "run" in the case where a job is executed, and a report informing that a state of the apparatus is "end" in the case where the recipe in the substrate processing apparatus 100 has been finished.

In Step 102 (S102), the sound control unit 404 refers to the relationship stored in the relationship storage unit 408 to confirm the mode of sound of the buzzer 310 corresponding to the state of the apparatus received by the state receiving unit 402.

In Step 104 (S104), the sound control unit 404 causes the buzzer 310 to sound with the sound mode corresponding to the received state of the apparatus. For example, in the case where the received apparatus state report is that "apparatus mode is in ready state", the buzzer 310 sounds the buzzer type of the continuous sound-3 for thirty seconds under the control of the sound control unit 404. Also, for example, when the received apparatus state report is "apparatus mode is in run state", the buzzer 310 sounds the buzzer type of continuous sound-4 for 30 seconds under the control of the sound control unit 404.

In step 106 (S106), the substrate processing control unit 400 judges whether or not the substrate processing has been completed. The sound control program 40 terminates the processing in the case where the substrate processing has been completed. If not, the process returns to the processing of S100. In this embodiment, in the case where an error occurs when the apparatus state is "run", it is possible to make sound in accordance with the setting for occurrence of error.

This invention is applicable not only to semiconductor production apparatuses as the substrate processing apparatuses but also to apparatuses such as LCD apparatuses for processing on glass substrates. The film formation processing include processings such as CVD, PVD, processings for forming oxide film and nitride film, and processings for forming film containing metal.

Industrial Applicability

This invention is usable for a substrate processing apparatus that is required to reliably inform about a running state thereof in substrate processing apparatuses for processing substrates of semiconductor devices and the like.

What is claimed is:

1. A substrates processing apparatus, comprising:
a plurality of signal indicators indicating a running state of the substrate processing apparatus,
a signal control device for controlling operations of the signal indicators, and
a display device for displaying operation conditions of the signal indicators,
wherein the display device comprises an input screen for inputting the running state as the operation conditions, and
wherein, after the operation conditions of the apparatus are inputted, the signal control device (1) controls the signal indicators to display the display corresponding to at least one operation cause indicating the running state that corresponds to each of the signal indicators and (2)

displays, on the display device with a different color the running state that corresponds to the signal indicators.

2. The substrate processing apparatus according to claim 1, wherein after the signal control device accepts a priority order of the operation states of each of the signal indicators, the signal control device controls each of the signal indicators to operate in accordance with the priority order.

3. The substrate processing apparatus according to claim 1, wherein after the signal control device accepts instructions from a host computer, the signal control device controls to display presence or absence of the instructions from the host computer with different colors.

4. A non-transitory computer-readable storage medium with an executable program performed by a signal control device controlling operations of a signal indicator for indicating a running state of a substrate processing apparatus according to claim 1, wherein the executable program performs the following steps:
   accepting operation conditions of the signal indicator;
   checking whether or not there is an error in the operation conditions; and
   when at least one of the operation conditions include the error, displaying that at least one of the operation conditions includes the error in a display screen.

5. The non-transitory computer-readable storage medium according to claim 4, wherein the program instructs the signal control device to further perform the following steps:
   accepting operation conditions and operation states of the signal indicator; and
   updating the display screen at a predetermined interval.

6. The substrate processing apparatus according to claim 1, wherein plural ones of the plurality of signal indicators make up a signal tower, wherein each signal indicator of the signal tower emits light different in color from a color emitted from other ones of the signal indicators of the signal tower and each signal indicator of the signal tower corresponds to one of the plurality of operation causes and emits light in a color that is a same color as displayed for that operation cause.

7. The substrate processing apparatus according to claim 1, wherein the plurality of signal indicators includes a signal tower and a buzzer.

8. The substrate processing apparatus according to claim 1, wherein the running state of the substrate processing apparatus includes an apparatus "RESET" state, an apparatus "WAITING FOR START" state, an apparatus "RUN" state, an apparatus "END" state and an apparatus "IDLE" state.

9. The substrate processing apparatus according to claim 1, wherein the running state of the substrate processing apparatus includes a carrier state, wherein the carrier state includes a "carrier being carried in" state and a "carrier being carried out" state.

10. The substrate processing apparatus according to claim 1, wherein the input screen is further capable of inputting a state of carrier conveyance and a state of host communication, and
   wherein the display device displays, with a different color, the lighting or blinking state of the signal indicators for each of the running states upon at least one of the running state of the substrate processing apparatus, the carrier state and a host communication state meeting a predetermined condition.

11. The substrate processing apparatus according to claim 10, wherein the display device displays the state of the host communication by a priority instruction when both the running state of the substrate processing apparatus, or carrier state, and the state of the host communication meet a predetermined condition.

12. A displaying method for a substrate processing apparatus comprising a plurality of signal indicators indicating a running state of the substrate processing apparatus, and
   a display device for displaying operation conditions of the signal indicators, the display device comprising an input screen for inputting the running state as the operation conditions,
   the display method comprising:
   after the operation conditions of the apparatus are inputted, the signal control device controls the signal indicators to display at least one operation cause indicating the running state that corresponds to each of the signal indicators; and
   display on the display device with a different color the running state that corresponds to the signal indicators.

13. The displaying method according to claim 12, further comprising:
   displaying a setting screen for setting operation conditions of the signal indicators, wherein a priority order of the operation states is selected and displayed in the setting screen.

14. The displaying method according to claim 12, further comprising:
   displaying a monitor screen for understanding operation conditions and operation causes of the signal indicators, wherein presence or absence of the instructions from a host computer in each of the operation conditions with different colors is displayed in the monitor screen.

15. The displaying method according to claim 14, wherein the display device further comprises a monitor screen for displaying the running state as displayed by the signal indicators,
   and wherein the display device displays the running state as displayed by the signal indicators with or without indication of the host computer on the monitor screen.

16. The displaying method according to claim 8, wherein plural ones of the plurality of signal indicators make up a signal tower, wherein each signal indicator of the signal tower emits light different in color from a color of light emitted from other ones of the signal indicators of the signal tower, and each signal indicator of the signal tower corresponds to one of the plurality of operation causes and emits light in a color that is a same color as displayed for that operation cause.

17. The displaying method according to claim 12, wherein the plurality of signal indicators include a signal tower and a buzzer,
   and wherein the method includes displaying by a lighting or blinking state of the signal tower that the buzzer is sounding.

18. The displaying method according to claim 17, wherein the display device further comprises an input screen for inputting operation condition of the buzzer in accordance with apparatus states of the substrate processing apparatus,
   and wherein the method includes displaying with or without operation of the buzzer, a period of the buzzer operation and a kind of the buzzer operation on the input screen.

* * * * *